United States Patent [19]

Berg

[11] E Re. 31,114

[45] Reissued Dec. 28, 1982

[54] ELECTRICAL CONNECTOR

[75] Inventor: William E. Berg, Prior Lake, Minn.

[73] Assignee: Tektronix, Inc., Beaverton, Oreg.

[21] Appl. No.: 207,515

[22] Filed: Nov. 17, 1980

Related U.S. Patent Documents

Reissue of:

[64] Patent No.: 4,150,420
Issued: Apr. 17, 1979
Appl. No.: 861,066
Filed: Dec. 15, 1977

U.S. Applications:

[63] Continuation of Ser. No. 631,591, Nov. 13, 1975, abandoned.

[51] Int. Cl.[3] ..... H01R 9/09
[52] U.S. Cl. ..... 339/17 CF; 361/411
[58] Field of Search ..... 339/17 CF, 174, 176 MF; 174/52 FP; 361/398

[56] References Cited

U.S. PATENT DOCUMENTS

| | | | |
|---|---|---|---|
| 3,054,879 | 9/1962 | Soreng | 200/159 B |
| 3,199,067 | 8/1965 | Stutzman | 339/176 MP |
| 3,335,327 | 8/1967 | Damon et al. | 339/17 CF X |
| 3,597,660 | 8/1971 | Jensen et al. | 361/398 |
| 3,600,528 | 8/1971 | LePosavic | 200/159 B |
| 3,670,205 | 6/1972 | Dixon et al. | 361/416 |
| 3,717,737 | 2/1973 | Shimojo | 200/159 B |
| 3,874,768 | 4/1975 | Cutchaw | 339/17 CF |
| 3,904,262 | 9/1975 | Cutchaw | 339/17 CF |
| 3,987,259 | 10/1976 | Larson | 200/159 B |
| 4,072,816 | 2/1978 | Gedney et al. | 339/17 CF X |

*Primary Examiner*—Eugene F. Desmond
*Attorney, Agent, or Firm*—Thomas J. Spence

[57] ABSTRACT

This disclosure describes an electrical connector for joining microcircuit or microcircuit modules, such as leadless integrated or hybrid circuit carriers to utilization means, such as printed or etched circuit boards or similar means. The electrical contacts through which the microcircuit and utilization means are connected are formed and etched in place on an elastomeric material, precisely located; the material acting as a restoring force to maintain connection. The connector when used in a system maintains transmission line mediums in a single environment.

9 Claims, 10 Drawing Figures

ELECTRICAL CONNECTOR

Figure 1:
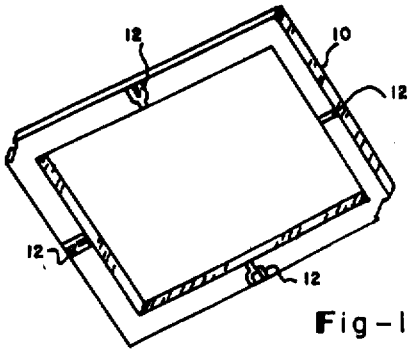

Matter enclosed in heavy brackets [ ] appears in the original patent but forms no part of this reissue specification; matter printed in italics indicates the additions made by reissue.

This is a continuation of application Ser. No. 631,591 filed Nov. 13, 1975, now abandoned.

BACKGROUND OF THE INVENTION

In the prior art there are various types of connectors in general use. Numerous expedients exist for the connection of elements of flexible circuitry to each other or to printed circuit boards having like spacing between their conductive leads. For example, one of the more common type of connectors uses male or female components where one component is mounted on a circuit board and the other attached to a conductor. This is quite bulky, requires considerable area and transmission mediums are not maintained. Another connection scheme for overcoming the disadvantages of bulkiness and area required is to use a cable which is preferably flat and having insulation removed at one end [is] placed over conductors on a circuit board which are in a parallel array, spaced the same distance apart as the conductors in the cable. A clamp is placed over the cable to hold it against the circuit board. This system, however, has disadvantages in that miniature circuitry, such as found in modern elctronic apparatus, does not fully meet the requirements. To overcome this disadvantage, schemes using metal to metal contact between flexible circuit conductors and plated leads of a similar circuit or of a terminal board board which are pressed together by a compressive compression element as, for example, a multifingered spring which applies individual force from the insulated side of the flexible circuit and mounted in a clamping bar that fastens, clips or otherwise holds together the cable elements being connected. The disadvantage here, of course, being that the transmission mediums environment is changed by added capacitance of the metal spring elements and high frequency operation is quite limited.

Another connecting system presently in use on small square or rectangular leaded ceramic packages is the conventional reflow soldering technique. This, however, requires special production equipment and heat becomes a problem. As described in "Electronics", July 10, 1975, pages 39 and 40, a solderless connector consisting of alternate vertical layers of nonconductive and conductive silicone rubber fits between the leadless carrier and the surface of a printed circuit board. The combination resembles a sandwich, which, when pressed together electrically connects conductive elements on the printed circuit board and contacts on the integrated circuit carrier together. A disadvantage, however, is that well matched, high frequency connections are not easily obtainable.

SUMMARY OF INVENTION

The electrical connector, according to subject invention, is used to connect, say, a glass teflon etched circuit board transmission line, usually 50 ohm characteristic [impedence] *impedance* to a transmission line, again usually 50 ohm, of a microcircuit, i.e. hybrid. Additionally, the subject invention is extended to also connect DC or ground connections of the microcircuit to the etched circuit board. The connector may be advantageously employed where the circuit board and microcircuit to be connected has small closely spaced transmission mediums. For such a connection, the conductors will have the same configuration as the circuit board and microcircuit. A system employing the connector exhibits well matched high frequency connections previously unobtainable, as well as maintaining a single transmission medium environment. Considerable cost savings with improved performance over prior approaches are obtainable as well as mass production.

Basically, the connector according to the present invention [comprise] *comprises* contacts secured in place on an elastomeric material such as silicone rubber and being of small size precisely located; the rubber acts as a restoring force and has a low dielectric constant. The system continues transmission line mediums in a single environment.

It is, therefore, an object of the present invention to provide a new electrical connector.

It is a second object of the present invention to provide a new electrical connector system.

It is a third object of the present invention to provide a new electrical connector for joining microcircuits to utilization means.

It is a fourth object of the present invention to provide a new electrical connector having contacts secured in place on an elastomeric material that are of small size and precisely located.

It is a fifth object of the present invention to provide a new electrical connector for maintaining transmission line environments.

It is a sixth object of the present invention to provide a new electrical connector at a minimum expense.

It is a seventh object of the present invention to provide an electrical connector which can be mass produced.

It is an eighth object of the present invention to provide an electrical connector which allows microcircuits to be easily replaceable.

It is a ninth object of the present invention to provide an electrical connector for DC (low frequency) through high frequency applications.

It is a further object of the present invention to provide a new electrical connector that provides optimum heat transfer of thermal energy from microcircuit to heat sink.

It is yet another object of the present invention to provide a switch employing contacts on an elastomeric material.

It is still yet another object of the present invention to provide a relay employing contacts on an elastomeric material.

It is a further object of the present invention to provide a process for bonding metal to an elastomeric material.

The foregoing and numerous other objects, advantages, and inherent functions of the present invention will become apparent as the same is more fully understood from the following description which describes the subject invention; it is to be understood, however, that the preferred embodiment is not intended to be exhausting nor limiting of the invention, but is given for purposes of illustration in order that others skilled in the art may fully understand the invention and principles thereof and the manner of applying it in practical use so that they may modify it in various forms such as may best be suited to the conditions of the particular use.

The subject matter of the invention, both as to organization and method of operation may best be understood by reference to the following description taken in conjunction with the accompanying drawings, wherein like reference characters refer to like elements.

DESCRIPTION OF THE INVENTION

Figure 2:
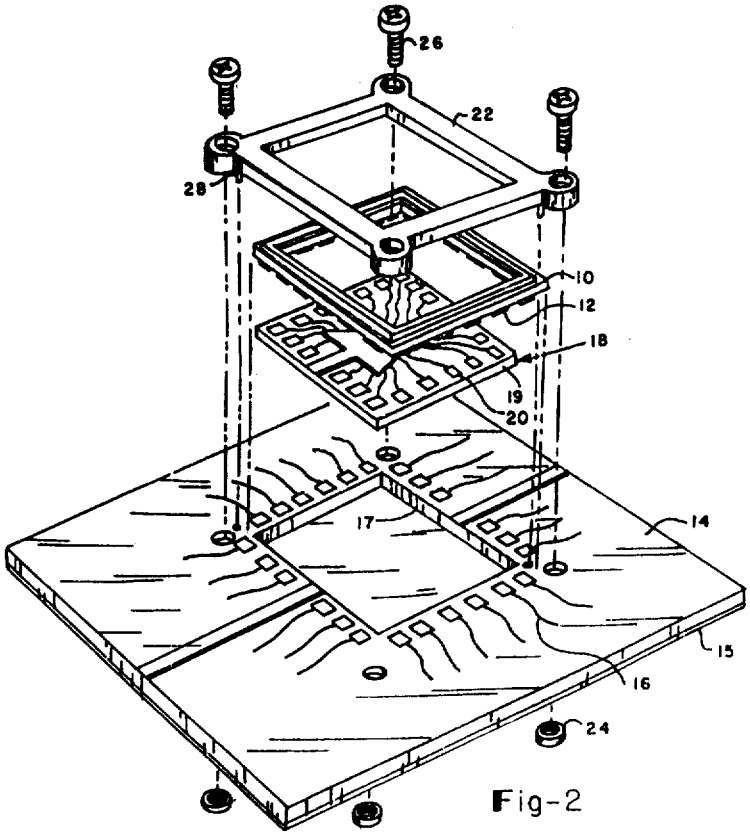
Figure 3A:
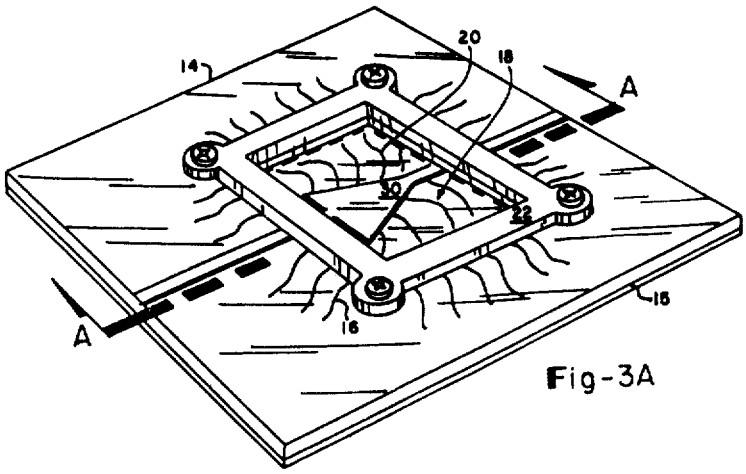
Figure 3B:
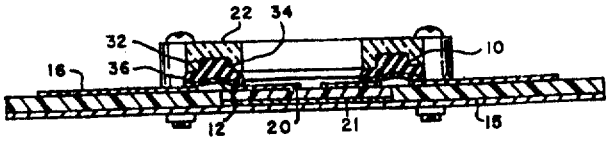
Figure 4:
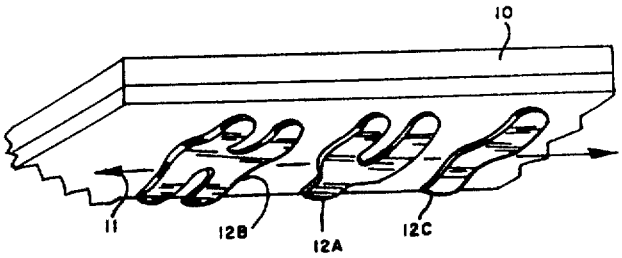
Figure 5A:
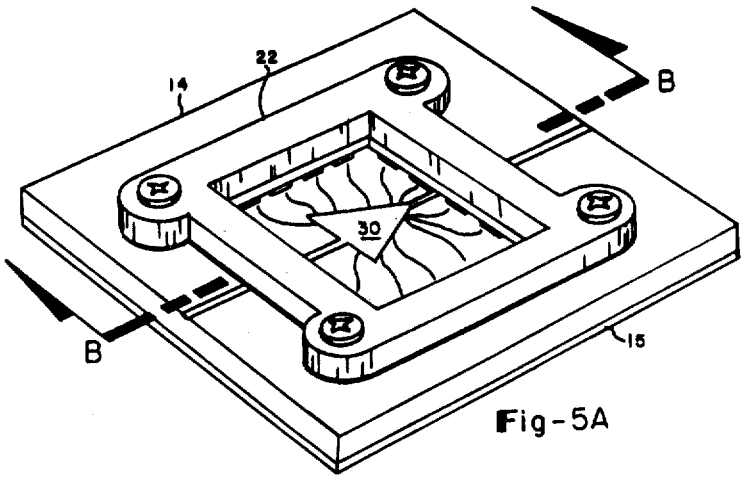
Figure 5B:
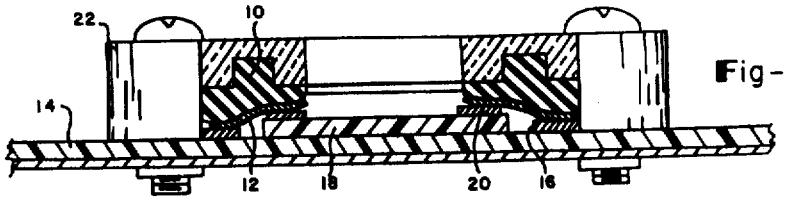
Figure 6:
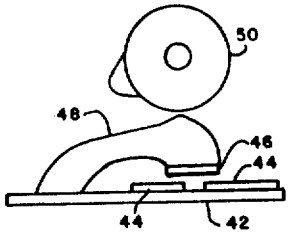
Figure 7:
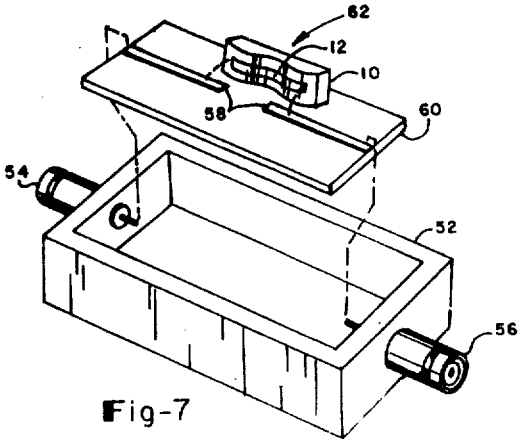

In the drawings:

FIG. 1 details a new electrical connector;

FIG. 2 details a new microcircuit to utilization means connector;

FIG. 3, including FIGS. 3A and 3B, is a completed connector system according to FIG. 2;

FIG. 4 details the contact means for the connector according to the present invention;

FIG. 5, including FIGS. 5A and 5B, details a second embodiment of the new microcircuit to utilization means according to the present invention;

FIG. 6 details a switch in accordance with the present invention;

FIG. 7 details a relay in accordance with the present invention; and

Figure 8:
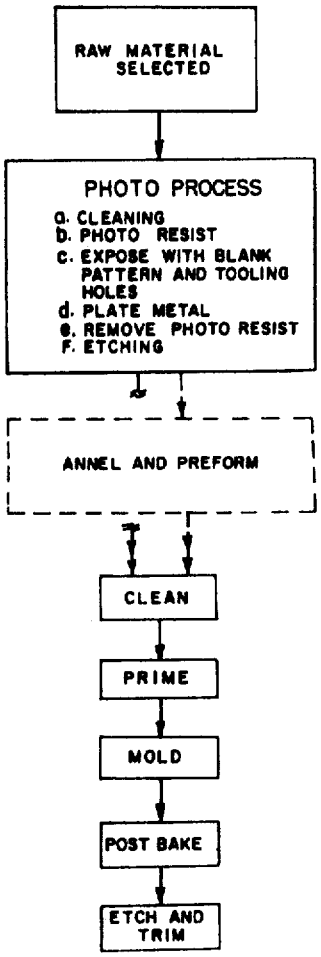

FIG. 8 is a block diagram of a flow chart detailing the process of forming the connector system according to the present invention.

DESCRIPTION OF THE INVENTION

Referring now to the drawings and in particular to FIG. 1, there is shown a new electrical connector, an object of the subject invention. An elastomeric material 10 has contact means 12 secured thereon; the elastomeric material acting as a restoring force for the contacts and the contacts for providing, say, an electrical connection between a microcircuit and a utilization means. In the preferred embodiment, the connector of the subject invention employs as the elastomeric material, a 50 durometer silicone rubber compound with low compression set. It should be emphasized that the 50 durometer rating is given as the preferred rating only and other ratings can be used. Contacts 12 may be of any desired shape or design while the number, spacing, etc. of the connectors is determined by the number of connections required by the microcircuit and are preferably gold-plated. The process for securing contact means 12 to the elastomeric material will be described elsewhere in this specification. Thus, there is provided a new contact comprising an elastomeric material and contact means secured to the material.

Referring now to FIG. 2, there is shown a new microcircuit to utilization means connector system including a utilization means 14 such as printed or etched circuit board or similar means having transmission mediums 16, a microcircuit means 18 such as leadless integrated circuit or hybrid circuits, including transmission mediums 20, and an elastomeric material 10 having contact means 12 secured thereon. In addition, there is provided a unit 22 which provides a means for removably carrying the elastomeric material (not essential that elastomeric material be carried as will be described elsewhere in this specification) and is removably fixed to the utilization means for maintaining positive engagement of the contacts 12 on the transmission mediums 16 and 20.

Unit 22, preferably a polyphenylene sulfide resin, is removably fixed to the utilization means 14 via conventional means such as nut and bolt assemblies 24, 26 respectively, the latter passing through mounting means provided in both the unit 22 and circuit board or utilization means 14. Provided as a portion of unit 22 are alignment means 28 which are removably received by further conventional means provided in the utilization means 14. Utilization means 14 includes a ground plane 15 provided on a surface opposite the surface containing transmission mediums 16, these mediums being of correct width and spacing from ground plane forming a transmission line defining a micro-strip transmission line. Alternatively, a ground plane 15 may be provided on the transmission medium side of the utilization means and being properly spaced from the transmission line to form a coplanar transmission line. As the formation of either type transmission line for providing a transmission line of certain characteristic impedance is well known to those having ordinary skill in the art, no further discussion thereof is deemed necessary. Utilization means 14 also includes a device locating means 17 such as, for example, an opening into the upper side of the utilization means and extending inwardly to ground plane 15. }

Referring now to FIG. 3, and in particular to FIG. 3A, there is shown the completed connector system previously described for FIG. 2. The connector, according to the subject invention, maintains transmission mediums 16, 20 of utilization means 14 and microcircuit means 18 respectively in the same or a single environment, i.e., no means such as coaxial connector means are required to connect the transmission mediums together. This, of course, is an important object of the subject invention. Microcircuit means 18 including transmission medium 20 is disposed into the device locating means 17 so that the transmission mediums 16, 20 are substantially [co-planer] *co-planar* with each other and precisely aligned. [Co-planer] *co-planar* is in the sense of mechanical alignment.) Disposed thusly, microcircuit means 18 connects to, by pressure of the elastomeric material, the ground plane 15 to form a continuous transmission line of uniform characteristic impedance and of the same geometry; in the same environment. As mentioned above, the microcircuit means 18 is precisely aligned in a device locating means 17. This is accomplished in a plurality of ways, but the most important is that during manufacture, transmission medium 16 and device locating means 17 must reflect the microcircuit means used. The other ways including alignment means 28 and the nut and bolt assemblies 24, 26 will be taken up again elsewhere in the description. Also shown in FIG. 3A is the element 30 which represents the working part of the microcircuit means 18. Element 30 could be, for example, an amplifier, a power supply module, digital circuit, etc. It should be noted that the microcircuit means 18 defining the working part of the means and the transmission mediums are all formed on a substrate 19. Substrate 19 is a ceramic in the preferred embodiment. It should be noted that the drawings show the element 30 to a medium 20 which appears much larger than any other, as well as a larger medium 16 on utilization means 14. These large mediums are shown for purposes of clarity only and are not to be taken as different from the other mediums.

FIG. 3B is a cross-sectional view of the system shown in FIG. 3A taken along the line AA. As previously stated, and as shown in the drawings, the elastomeric material is carried by the unit 22. This is accomplished by providing in unit 22 a channel 32 into which the elastomeric material is removably placed, the resiliency of the elastomeric material maintaining connection. Elastomeric material 10 is in the preferred embodiment, T shaped with a first portion 34 for insertion into channel 32 and a second portion 36 onto which contact means 12 is secured. It can also be seen in this drawing that contact means 12 is serpentined. This insures that in the mated state, i.e., contacts 12 to transmission medium 16, 20, equal pressure will be applied all along the edges of microcircuit means 18 to assure (1) good thermo contact and (2) good electrical contact. (It should be mentioned that DC connections are also made the same way.) Thermo energy in the microcircuit is transferred to the ground plane by conduction. Although not shown in the drawings, a heat sink may be secured to the ground plane side of the utilization means via the nut and bolt assemblies to provide additional heat sinking of the microcircuit unit. This provides optimum heat transfer of thermo energy from the microcircuit and is an important object of the present invention. It should also be noted that the securing means of unit 22 extend beyond the channel 32 to provide a positive stop feature so that the elastomeric material cannot be crushed when secured to the utilization means. Additionally, and it will be explained later in this specification, the ridges formed by the undulating shape of the connector allows (forces) a wiping action to be made at contact. Thus, there is provided a microcircuit to utilization means connection system which comprises a body having a chamber, an elastomeric material adapted to mount in said chamber, contact means secured to said material and protruding a distance away from said material, and being secured to said material away from where adapted to mount in said chamber, and means for removably afixing said body over said element and circuit medium, thereby, to bias said contact means to [positive] *positively* engage said element and circuit medium. Further explanation of the above discussed ridges will be described in detail elsewhere in the description.

Shown in FIG. 4 are various shaped contact means 12 which can be utilized by the present invention for the system shown in FIG. 3. For example, the contact means 12A may include a pair of spaced leg portions which are spaced apart and extend substantially parallel from [thier] *their* free ends to their other ends joined in common. The leg portions may have [bifercated] *bifurcated* contacts at their free ends for further engaging with the transmission mediums. Contact means 12B may include two pairs of spaced leg portions which are spaced apart and extend substantially parallel from their free ends to the other ends or the contact may be as the contact means 12C which is a single leg portion. The contact means 12A–12C are flat in the direction of double headed arrow 11. It should be emphasized that the contacts shown in FIG. 4 are the preferred, but that other shapes and designs can be used depending upon the particular application.

Referring now to FIG. 5, there is shown another embodiment of the subject invention. FIG. 5A shows the contact system similar to FIG. 3A but in FIG. 5B, which is taken along the line BB of FIG. 5A, the contact means 12 is provided in a stepped rather than flat configuration. This is because microcircuit means 18 is mounted flush with the surface of utilization means 14 which requires that the serpentine shape of the contact means 12 be stepped, since the transmission mediums 16 and 20 are now not [co-planer] *co-planar*. As the microcircuit is mounted flush with the surface of utilization means 14, a device locating means such as device locating means 17 of FIG. 2 is not required and the principal locating means becomes the alignment means 28, shown in FIG. 2. Additionally, the elastomeric material 10 in this embodiment is adapted to be carried by unit 22, thus the unit is channeled so that when secured to utilization means 14 it will capture material 10 to precisely locate the contacts. Another embodiment may, however, include no channel and the unit 22 made to forcibly hold the elastomeric material 10 in position once secured to the utilization means 14.

The above described connector or connector systems has advantages over other connector schemes in that in the mated state equal pressure is applied all along the microcircuit means which insures good electrical contact and good thermal contact. By careful design of the shape of ridges in the elastomeric material, a wiping action is made at contact or during connection. The elastomeric material acts as a restoring force and maintains pressure during the lifetime of the connector, has good compression set characteristics and is inert to acid and most all electronic chemicals except strong solvents like [tolene] *toluene*. Since contact means 12 mate mediums 16 and 20, as described, thermal expansion of the substrate, i.e., used to carry the microcircuit means, does not break or interrupt the contact. Contact is always maintained during shock and vibration. The connector system, according to the subject invention, makes tests and integration of system of microcircuits easy as well as field replacement of a microcircuit. No soldering (bonding) to the substrate is necessary to make connection for a next higher assembly. Considering manufacturing capability, accumulation of manufacturing tolerances for combined components of the contact system are about plus and minus 0.0010-inch. Therefore, the contact system can be mass produced.

Referring next to FIG. 6, there is shown a switch in accordance with the subject invention. A support plate 42 which could be similar to utilization means 14 includes fixed transmission line elements 44 secured to the support plate and a movable switch contact 46 secured to an elastomeric material mounting means 48 on said support plate for movement between a closed position engaging said fixed contact to join or connect transmission line elements and a open position spaced from said fixed contact and actuator means 50 for moving the movable switch contact toward and away from the support plate between said open and closed positions. Actuator means 50 could be, for example, a cam switch, a slide switch, etc. Alternatives to the switch include providing a plurality of fixed switch contacts attached to support plate and a plurality of movable switch contacts secured to the elastomeric material.

Referring now to FIG. 7, there is shown a relay in accordance with the present invention. A housing member 52 includes signal input and output connectors 54, 56 respectively, such as coaxial cable connectors, and means for connecting the signal input and output connectors to say interrupted transmission line means 58 on a substrate 60. The elastomeric material 10 having contact means 12 according to the present invention is next provided. To operate as a relay, solenoid or mechanical pressure indicated by the arrow 62 causes the contact means to connect the interrupted transmission line means allowing a signal to pass through the unit. Therefore, the interrupted transmission lines can be considered as fixed relay contacts carried by the housing, the elastomeric material and contact means as movable relay contacts, and the solenoid pressure as an actuator means for moving the movable relay contact between a closed position and an open position. An alternative would be to provide additional movable relay contacts and having common actuator means.

Turning now to the process of securing the contact means to the elastomeric material, an object of the subject invention, there is shown in FIG. 8 a block diagram flow chart therefor. The first step in the process, as in any process, is the selection of a raw material. Various base metals can be used; wrought or rolled nickel, an alloy of Beryllium-Nickel, or an alloy of Copper-Beryllium which is preferred. It has been found that nickel presents slight manufacturing problems, such as bending too easily, creases, etc., whereas the alloy of Beryllium-Nickel reduces the above manufacturing difficulties but it is hard to etch, which is required by the hereinafter described process. The Copper-Beryllium alloy, however, allows most of the manufacturing and process difficulties to be overcome. The thickness of the wrought or rolled alloy is important to the process; too thick invites undercutting which eventually leads to the possibility of short circuits, too thin invites manufacturing handling problems. A thickness of 0.0015 to 0.0025, preferably 0.002-mils thick, has been utilized. (Undercutting is well known in circuit board and photo processing techniques.)

The second step of the process includes a blanking and punching of the raw material. Blanking enables the wrought or rolled alloy to be handled easily by simply cutting the material to a size necessary for the process. Punching simply punches tooling holes into the material so that further processing and alignment is possible.

The third step of the process uses conventional photographic techniques to provide the contact means. The process is fully explained on pages 1-5 through 1-17, specifically FIG. 7b on page 1-11, in Handbook of Electronic Packaging, edited by Charles A. Harper, Copyright 1969 by McGraw-Hill, Inc. The desired shape, number and spacing of the contact means (three are shown in FIG. 4 as 12A, 12B and 12C) are provided in the form of a contact pattern, or mask, and precisely aligned using the punched holes. A negative mask is preferred, but can be a positive. Once the desired contact areas have been photographically defined in the photo resist, the actual contact means are provided by plating a layer of nickel, followed quickly by a plating layer of gold, each having a thickness of 5 to 6 microns. As is well known, the two platings must be preformed in a very short time to prevent oxidation of the metals. Additionally, if nickel is used as the raw material, onto which the desired contacts are formed, only gold need be plated. Further, gold contacts are preferred because gold is usually the transmission mediums previously discussed. Thus, gold transmission lines on the utilization means, gold contacts, and gold transmission mediums on the microcircuit (gold-gold-gold) provides a very compatible connection scheme. The photo resist is then removed.

Step four of the process is to heat and cool the photographically processed unit for softening and making the metal contacts less brittle, i.e., annealing. A flat contact, say, for use in a connection system similar to that shown in FIG. 3 where the transmission mediums are substantially [co-planer] *co-planar* need not be necessarily subjected to annealing, but it is preferred. Where the connection system is used, similar to that shown in FIG. 5, i.e., a stepped configuration, the annealing process is required and even more so when the contacts are nickel under gold as in the preferred embodiment. The annealing temperature should be between 400° and 600° C., preferably 500° C., for one hour. Step 4 also includes preforming the annealed unit to the desired shape, i.e., step. The preforming is similar to conventional methods whereby the annealed unit is merely placed over a die and pressure applied via some means to form the annealed unit into the shape of the die.

The annealed and preformed unit, or annealed unit, as the case may be, is then subjected to a cleaning, partial etch and application of a primer on the raw material opposite the side to which the metal contacts have been deposited. The partial etch affects the monolayers of the material to insure a clean surface onto which the elastomeric material will be applied. Having the surface cleaned and primed, the unit is placed into a die installed in a conventional transfer molding machine. The elastomeric material is then injected in the areas desired. In the case of the subject invention, the elastomeric material is injected along the contacts but on the opposite side. The unit then undergoes a partial cure in the transfer molding machine. After the partial cure, the entire unit is subjected to a postbaking process to obtain a final cure and to outgas any curing agents, catalyst by-products, etc. and to obtain the optimum characteristics of the elastomeric material.

The final step of the process is to remove the raw material which is exposed, i.e., not covered by gold. This is accomplished by a spray etch and enables all exposed raw metal material to be removed without affecting the contact or elastomeric material. The unit is, of course, trimmed after etching to conform to the drawing.

Thus, there has been described a process for securing metal contacts to an elastomeric material, another object of the subject invention.

While there has been shown and described the preferred embodiments according to the subject invention, it will be apparent to those skilled in the art that many changes and modifications may be made without departing from the invention in its broader aspects. For example, two connection systems could be disposed on opposite sides of the utilization means and mounted thereto by common securing means, or a series of connection systems could be utilized. Therefore, the appended claims are intended to cover all such changes and modifications that fall within the true spirit and scope of the invention.

The invention is claimed in accordance with the following:

[1. A high frequency electrical connector system for making electrical connections between a microcircuit and a circuit board comprising:

a circuit board having first electrical conductive path means fixed upon a surface thereof;

a microcircuit having second electrical conductive path means fixed upon a surface thereof;

location means provided by said circuit board for locating said microcircuit along said circuit board so that said first and second electrical conductive path means are positioned adjacent to each other; and means for electrically connecting said first and second electrical conductive path means together, including (a) frame means, (b) elastomeric material removably attached to said frame means and being deformable to exert a resilient force, (c) conductive material in the form of electrical contacts bonded to an undulating surface of said elastomeric material to electrically engage respective ones of said first and second electrical conductive path means, and (d) securing means for removably securing said frame means to said circuit board with said electrical contacts on said elastomeric material electrically engaging said first and second electrical conductive path means, said elastomeric material being deformed by said securing means so that said resilient force causes said electrical contacts to wipingly engage said first and second electrical conductive path means thereby forming an electrical connection therebetween and maintaining said microcircuit in position on said circuit board.]

[2. A high frequency electrical connector system of claim 1 wherein said circuit board has a ground plane on another surface thereof and said microcircuit has a conductive coating on another surface thereof, said conductive coating being in electrical engagement with said ground plane.]

[3. A high frequency electrical connector system of claim 1 wherein said first and second electrical conductive path means are in the same plane.]

[4. A high frequency electrical connector system of claim 1 wherein said first and second electrical conductive path means are positioned in stepped relationship to each other.]

[5. A high frequency electrical connector system of claim 1 wherein said location means comprises an opening in said circuit board into which said microcircuit is disposed.]

*6. A high-frequency electrical connector system for electrically interconnecting a conductive path of a first circuit element with a conductive path of a second circuit element, said system comprising:*

*(a) a resilient member having a surface defined by two protruding portions and an intermediate indented portion;*

*(b) a contact member of flexible matallic material overlaying a substantial part of each said portion of said surface of said resilient member and extending no further than the boundaries of said surface, said contact member also having a surface defined by two protruding portions and an intermediate indented portion, said surfaces of said resilient member and said conduct member being further configured such that said resilient member provides a restoring support for said contact member and such that a common force applied against both protruding portions of said contact member causes said portions to move away from each other;*

*(c) rigid frame means for holding said resilient member and said contact member against said circuit elements such that a first protruding portion of said contact member touches a conductive path of said first circuit element and a second protruding portion of said contact member touches a conductive path of said second circuit element; and*

*(d) means for urging said frame means, and thereby said resilient member and said contact member, further against said circuit elements so as to cause said protruding portions of said contact member to move away from each other and thereby wipingly engage said conductive paths.*

*7. The connector system of claim 6 wherein said frame means includes means defining a chamber, and wherein said resilient member includes a third portion configured for mating insertion into said chamber.*

*8. The connector system of claim 6 wherein said resilient member is elongate in form, and wherein said surface thereof defines a pair of protruding ridges separated by an elongate indentation, further comprising a plurality of said contact members spaced along said resilient member in a longitudinal direction.*

*9. The connector system of claim 8 wherein each said contact member extends across said resilient member in a lateral direction.*

*10. The connector system of claim 6 wherein a first protruding portion of said contact member is separated from a second protruding portion by a first distance in a first direction and offset from said second portion by a second distance in a second direction so as to define with said second portion a contact member of stepped configuration for interconnecting conductive paths in non-coplanar alignment.*

*11. The connector system of claim 6 wherein said frame means comprises a rigid frame member of rectangular configuration, and wherein said resilient member is of mating rectangular configuration, further comprising a plurality of said contact members spaced around the periphery of said resilient member so as to permit the interconnection of a like plurality of conductive paths of a first circuit element located within the enclosure of said frame member with a like plurality of conductive paths of a second circuit element located without said enclosure.*

*12. The connector system of claim 6 wherein a surface of said resilient member proximate at least one edge thereof defines a pair of elongate protruding ridges separated by an elongate indentation and wherein each said contact member spaced therealong extends across both said ridges.*

*13. The connector system of claim 6 wherein said indented and protruding portions of said surface of said contact member define an undulating surface including a concave portion interposed between two convex portions.*

*14. The connector system of claim 6 wherein said contact member is of longitudinal configuration having a width dimension substantially greater than its thickness dimension.*

* * * * *